(12) United States Patent
Huang et al.

(10) Patent No.: US 8,563,439 B2
(45) Date of Patent: Oct. 22, 2013

(54) METHOD OF PITCH DIMENSION SHRINKAGE

(75) Inventors: Ming-Jie Huang, Hsinchu (TW); Chen-Ping Chen, Toucheng Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 406 days.

(21) Appl. No.: 12/842,162

(22) Filed: Jul. 23, 2010

(65) Prior Publication Data

US 2012/0021607 A1   Jan. 26, 2012

(51) Int. Cl.
    *H01L 21/302*   (2006.01)
(52) U.S. Cl.
    USPC .................................. 438/738; 257/E21.039
(58) Field of Classification Search
    USPC ......... 438/671, 689, 700, 702, 703, 717, 725, 438/736–738; 257/E21.039
    See application file for complete search history.

(56) References Cited

U.S. PATENT DOCUMENTS

| 6,042,998 A | 3/2000 | Brueck et al. |
| 6,395,644 B1 | 5/2002 | Hopper et al. |
| 6,780,782 B1 * | 8/2004 | Tsai et al. ..................... 438/725 |
| 7,183,205 B2 | 2/2007 | Hong |
| 7,390,746 B2 * | 6/2008 | Bai et al. ........................ 438/689 |
| 7,435,671 B2 | 10/2008 | Fuller et al. |
| 7,615,497 B2 * | 11/2009 | Bok et al. ...................... 438/736 |
| 2007/0049030 A1 * | 3/2007 | Sandhu et al. ................ 438/689 |
| 2007/0148968 A1 * | 6/2007 | Kwon et al. .................. 438/671 |

FOREIGN PATENT DOCUMENTS

| CN | 101051622 | 10/2007 |
| CN | 101299408 | 11/2008 |
| CN | 101447448 | 6/2009 |
| CN | 101673669 | 3/2010 |

* cited by examiner

*Primary Examiner* — Matthew Landau
*Assistant Examiner* — Candice Y Chan
(74) *Attorney, Agent, or Firm* — Lowe Hauptman & Ham, LLP

(57) ABSTRACT

An embodiment of the disclosure includes a method of pitch reduction. A substrate is provided. A first material layer is formed over the substrate. A second material layer is formed on the first material layer. A hardmask layer is formed on the second material layer. A first imaging layer is formed on the hardmask layer. The first imaging layer is patterned to form a plurality of first features over the hardmask layer. The hardmask layer is etched utilizing the first imaging layer as a mask to form the first features in the hardmask layer. The first imaging layer is removed to expose the etched hardmask layer and a portion of a top surface of the second material layer. A second imaging layer is formed and the process is repeated, such that first and second features are alternating with a pitch substantially half the original pitch.

20 Claims, 15 Drawing Sheets

METHOD OF PITCH DIMENSION SHRINKAGE

TECHNICAL FIELD

The disclosure relates generally to integrated circuit fabrication methods, and more particular to a method of fabricating integrated circuit with a reduced pitch.

BACKGROUND

Integrated circuits are commonly used to make a wide variety of electronic devices, such as memory chips. One aim in production is to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density. The feature width is sometimes referred to herein as F, and the width of the space between features is sometimes referred to herein as S.

Increases in circuit density often are limited by the resolution of the available photolithographic equipment. The minimum size of features and spaces that a given piece of photolithographic equipment can produce is related to its resolution capability. If one tries to define features in a photoresist which are smaller than the machine's minimum feature size, then the photoresist regions exposed to radiation may fail to correspond to the mask plate pattern, resulting in the photoresist features not being accurately reproduced.

The sum of minimum feature width and minimum space width producible with a given piece of photolithographic equipment is the minimum pitch that the piece of equipment can produce. Since for practical purposes, the minimum feature width can be considered to be approximately equal to the minimum space width, the minimum pitch that can be produced with a given piece of photolithographic equipment is approximately equal to double the minimum feature width that it can produce. Using contemporary photolithography techniques, one line (feature) and one space may be defined within the minimum pitch.

Some attempts have been made to try to reduce the pitch of an integrated circuit device below that of the minimum pitch produced lithographically, but these methods are difficult to control and show varying results.

In view of the drawbacks of the prior methods, it is necessary to provide a method that can reduce the pitch in a device below that producible by the lithographic process.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

Figure 1:
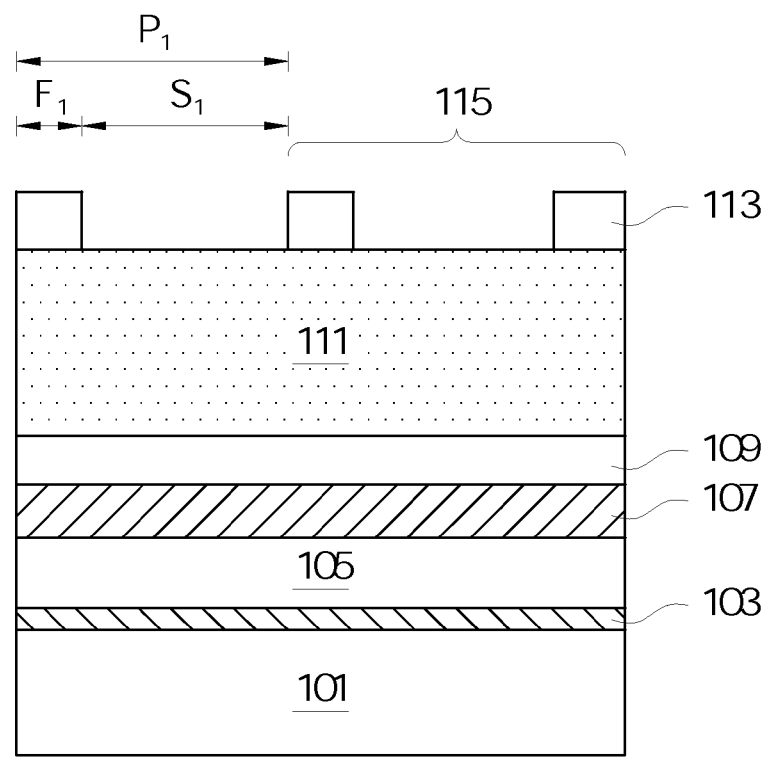
FIGS. 1 to 9 are cross-sectional views showing various stages during fabrication of a structure according to the first embodiment.

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

It will be understood that when an element as a layer, region or substrate is referred to as being "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, a particular patterned layer is "used as a mask" for a particular process step if it is the top layer present when the particular process step is performed, and also if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

FIGS. 1 to 24 are cross-sectional views showing various stages during fabrication of a structure according to various embodiments of this invention. The term "substrate" as described herein, refers to a semiconductor substrate on which various layers and integrated circuit components are formed. The substrate may comprise silicon or a compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The semiconductor dies are divided by scribe lines (not shown) between adjacent dies. The following process steps will be performed on each of semiconductor dies on the surface of the substrate.

Referring to the drawings, FIGS. 1 to 9 depict a first embodiment of the integrated circuit pitch reduction method of the present invention.

Referring to FIG. 1, a gate dielectric layer 103, a gate layer 105, a material layer 107, and a hard mask layer 109, a first imaging enhancement layer 111 and a patterned first photoresist layer 113 are formed over the substrate 100. The layers 105, 107, 109, 111 are patterned, as will be further discussed below, to form one or more gate structures over the substrate 100. Additional layers may be formed above and/or below the gate dielectric layer 103, the gate layer 105, the material layer 107, and the hard mask layer 109, the first imaging enhancement layer 111 and the first photoresist layer 113, including liner layers, interface layers, seed layers, adhesion layers, barrier layers, etc. Though the present example illustrates the patterning of one or more gate structures, it is understood that the material layers may be patterned to form any desired feature.

The gate dielectric layer 103 is formed over the substrate 100 by any suitable process to any suitable thickness. In various embodiments, the gate dielectric layer 103 may comprise silicon oxide, silicon oxynitride, silicon nitride, other suitable dielectric materials, a high-k dielectric layer comprising hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof.

The gate layer 105 is formed over the gate dielectric layer 103 by any suitable process to any suitable thickness. The gate layer 105 may comprise a work function layer. The work function layer comprises any suitable material, such that the layer can be selected to have a proper work function (also known as "tuning"). For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. The work function layer may includes doped conducting oxide materials. Alternatively, the gate layer 105 comprises aluminum, copper, titanium, tantalum, tantalum nitride, nickel silicide, cobalt silicide, TaC, TaSiN, metal alloys, other suitable materials, and/or combinations thereof. Further, the gate layer 105 may be doped polycrystalline silicon with the same or different doping.

The material layer 107 is formed over the gate layer 105 by any suitable process. The material layer 107 comprises oxide, silicon oxynitride, silicon nitride or other proper materials that may be used as a mask layer for the underlying gate layer 105 for the following etching process. In other words, the material layer 107 has a higher etch resistance than the gate layer 105 during the gate layer 105 etching process. The material layer 107 is formed to any suitable thickness. For example, the material layer 107 comprises a thickness of approximately 100 to 800 Å

The hard mask layer 109 is formed over the material layer 107 by any suitable process. The hard mask layer 109 comprises an oxide material, such as silicon oxide. Alternatively, the hard mask layer 109 comprises a nitrogen-containing material, such as silicon nitride, silicon oxynitride, other suitable nitrogen-containing materials, and/or combinations thereof. The hard mask layer may include an amorphous carbon material, silicon carbide, tetraethylorthosilicate (TEOS), other suitable materials, and/or combinations thereof. The hardmask layer 109 may be used as a mask for the underlying material layer 107 for the following material layer 107 etching process. In other words, the hardmask layer 109 has a higher etch resistance than the material layer 107 during the material layer 107 etching process. The hard mask layer 109 is formed to any suitable thickness. For example, the hard mask layer 109 comprises a thickness of approximately 100 to 400 Å

The first imaging enhancement layer 111 is formed over the hardmask layer 109 by any suitable process. The first imaging enhancement layer 111 may comprises organic layer, such as an anti-reflective coating (ARC) material, a polymer material, a photoresist material, and/or other suitable materials. The first imaging enhancement layer 111 can enhance the accuracy of image transfer from first photoresist layer 113. The first imaging enhancement layer 111 may be used as a mask for the underlying hardmask layer 109 in the following hardmask layer etching process. In other words, the first imaging enhancement layer 111 has a higher etch resistance than the hardmask layer 109 during the hardmask layer etching process.

The patterned first photoresist layer 113 is formed over the first imaging enhancement layer 111 by photolithography patterning processes. The processes may include photoresist coating (e.g., spin-on coating), soft baking, mask aligning, exposure, post-exposure baking, developing the photoresist, rinsing, drying (e.g., hard baking), other suitable processes, and/or combinations thereof. The patterned first photoresist layer 113 comprises a plurality of first features 115 over the first imaging enhancement layer 111. A pitch P1 is the minimum distance between the same points of two adjacent first features 115. The pitch P1 equals a width F1 of the first feature 115 plus a space S1 between adjacent the first features 115.

Figure 2:
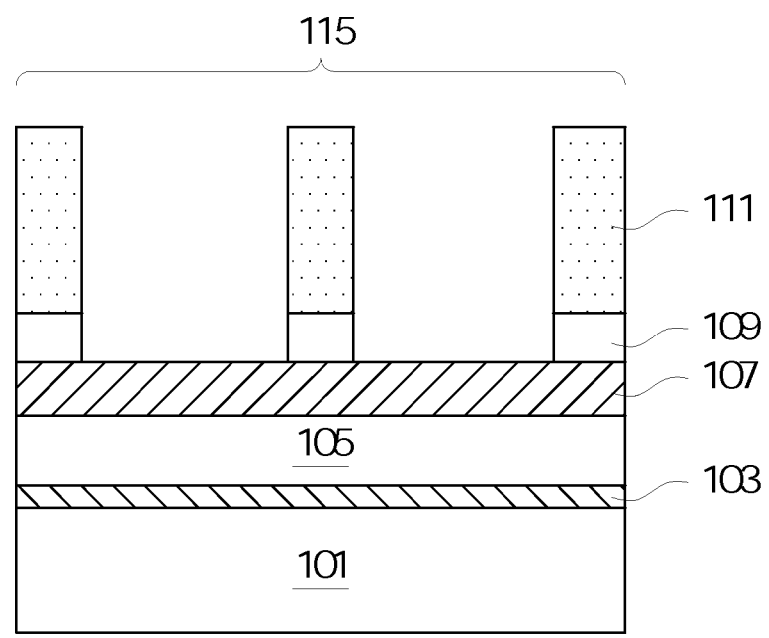

Referring to FIG. 2, the first imaging enhancement layer 111 and the hardmask layer 109 are patterned by using the first patterned resist 113 as a mask. The first features 115 are formed by etching the first imaging enhancement layer 111 and the hardmask layer 109. In one embodiment, a bottom anti-reflective coating (BARC) layer is used as the first imaging enhancement layer 111. A silicon oxynitride layer is used as the hardmask layer 109. The BARC layer is etched with a plasma process in a $HBr/O_2$ ambient environment. Then, the silicon oxynitride layer is etched with a plasma process in a $CF_4$ ambient environment. In one embodiment, the first patterned resist 113 is consumed and removed during the hardmask layer 109 etching process. A portion of a top surface 117 of the material layer 107 is exposed after the hardmask layer 109 etching process.

Figure 3:
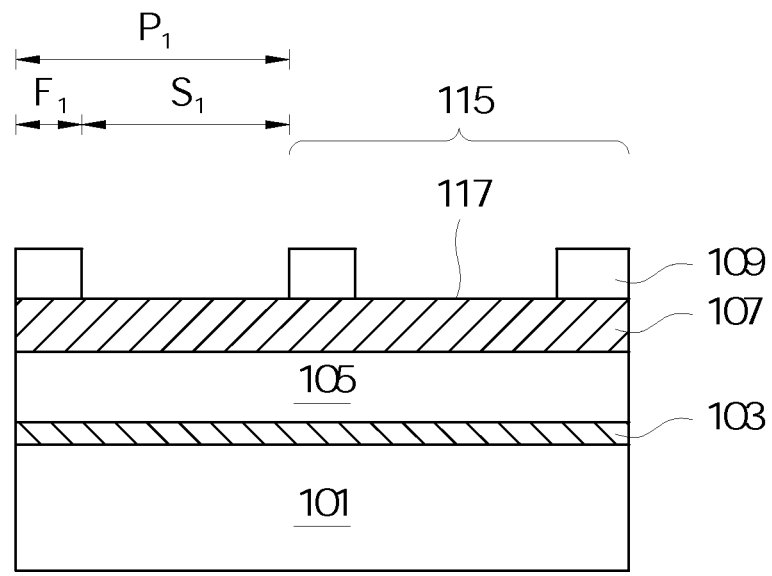

Referring to FIG. 3, the first imaging enhancement layer 111 on the hardmask layer 109 is removed. In one embodiment, a BARC layer is used as the first imaging enhancement layer 111. The first imaging enhancement layer 111 is ashed in an oxygen ambient environment. The patterned hardmask layer 109 is exposed.

Figure 4:
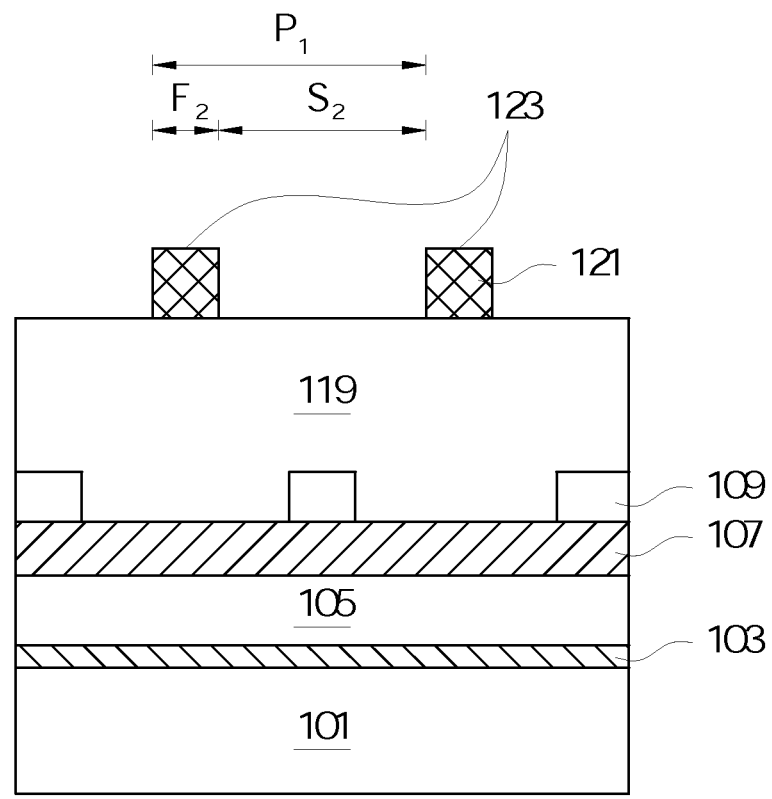

Referring to FIG. 4, a second imaging enhancement layer 119 is formed over the patterned hardmask layer 109 and the portion of the top surface 117 of the material layer 107. The second imaging enhancement layer 119 may comprises an organic layer, such as an anti-reflective coating (ARC) material, a polymer material, a photoresist material, and/or other suitable materials. In one embodiment, the second imaging enhancement layer 119 is the same material as the first imaging enhancement layer 111. The second imaging enhancement layer 119 fills in the spaces S1 betweens the first features 115 of the patterned hardmask layer 109. The second imaging enhancement layer 119 provides sufficient coverage of the surface topography of the underlying patterned hardmask layer 109.

Next, the patterned second photoresist layer 121 is formed over the second imaging enhancement layer 119 by photolithography patterning processes. The processes may include photoresist coating (e.g., spin-on coating), soft baking, mask aligning, exposure, post-exposure baking, developing the photoresist, rinsing, drying (e.g., hard baking), and/or combinations thereof in various embodiments. The patterned second photoresist layer 121 comprises a plurality of second features 123 over the second imaging enhancement layer 119. Each of the second features 123 between adjacent second features 123 has the pitch P1, the width F2, and the space S2. The pitch P1 equals the width F2 of the second feature 123 plus the space S2 between adjacent the second features 123. The first features 115 on the patterned hardmask layer 109 do not overlap the second features 123 on the patterned second photoresist layer 121. In other words, the first features 115 and the second features 123 are alternately arranged.

Figure 5:
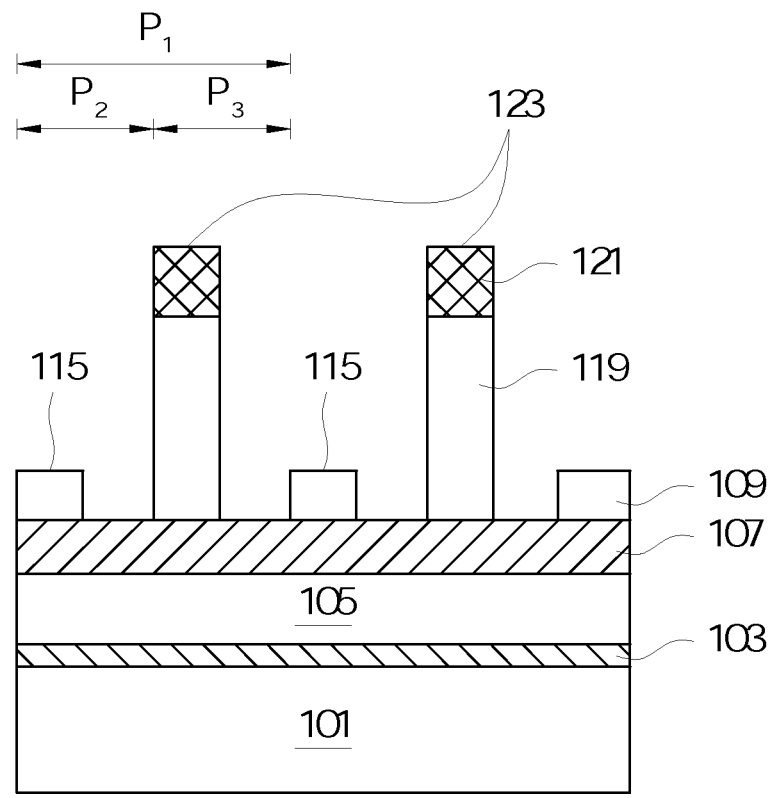

Referring to FIG. 5, the second imaging enhancement layer 119 is patterned by using the second patterned resist 121 as a mask. In one embodiment, a bottom anti-reflective coating (BARC) layer is used as the second imaging enhancement layer 119. The BARC layer is etched with a plasma process in a $HBr/O_2$ ambient environment. The second features 123 are transferred from the patterned second photoresist layer 121 into the second imaging enhancement layer 119 by etching. The first features 115 of the patterned hardmask layer 109 and the second features 123 of the patterned second imaging enhancement layer 119 are alternately arranged on the top surface of the material layer 107. Each of the first features 115 is flanked by two second features 123. Each of the first features 115 has a second pitch P2 to the adjacent second feature 123. Each of the second features 123 has a third pitch P3 to the adjacent first feature 115. The sum of the second pitch P2 and the third pitch P3 equal to the first pitch P1. In one embodiment, the second pitch P2 and the third pitch P3 are substantially equal. The second pitch P2 and the third pitch P3 are each substantially one-half of the first pitch P1. In other embodiments, at least one of the second pitch P2 and the third pitch P3 is less than 80 nm.

Figure 6:
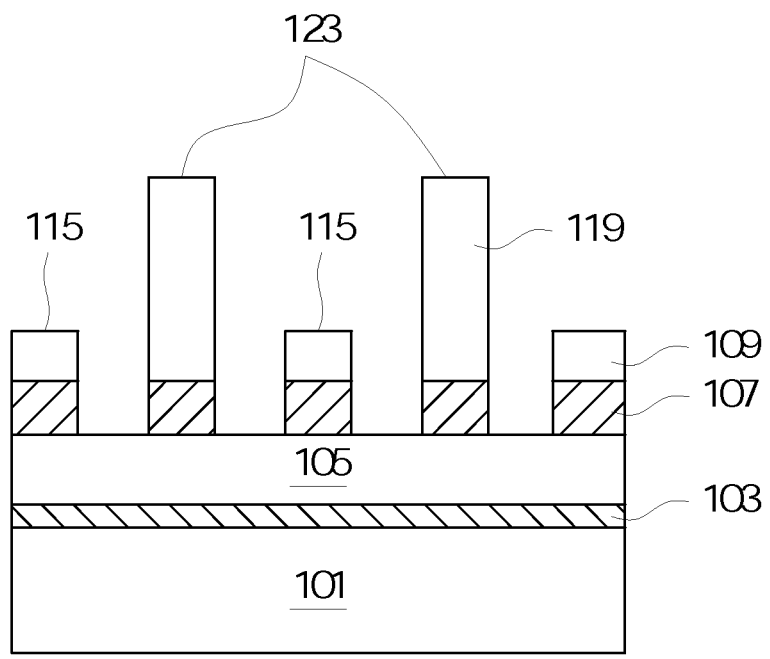

Referring to FIG. 6, the material layer 107 is patterned by using the patterned second imaging enhancement layer 119 and the patterned hardmask layer 109 as a mask. The first features 115 and the second features 123 are transferred into the patterned material layer 107. In one embodiment, an oxide layer is used as the material layer 107. The oxide layer is etched with a plasma process in $CF_4$ ambient environment. Each of the first features 115 is flanked by two second features 123. Each of the first features 115 has a second pitch P2 to the adjacent second feature 123. Each of the second features 123 has a third pitch P3 to the adjacent first feature 115. The sum of the second pitch P2 and the third pitch P3 equal to the first pitch P1.

Figure 7:
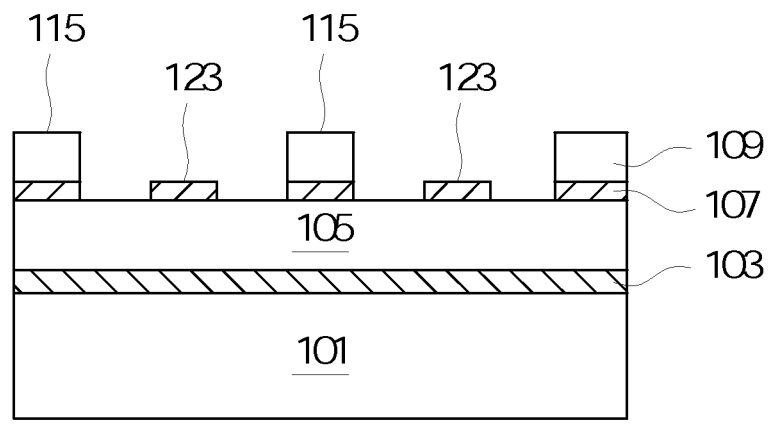

Referring to FIG. 7, the patterned second imaging enhancement layer 119 above the material layer 107 is removed. The first features 115 of a film stack of the patterned hardmask layer 109 and the patterned material layer 107, and the second features 123 of the patterned material layer 107 are used as a mask for the underlying gate layer 105. It is believed by the inventors that removal of the patterned second imaging enhancement layer 119 reduces the etching profile mircroloading during the etching of the gate layer 105.

Figure 8:
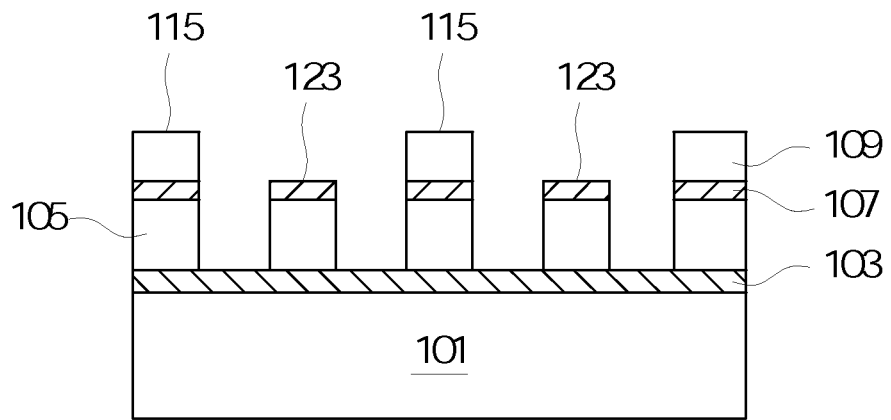

Referring to FIG. 8, the gate layer 105 is patterned by using the first features 115 of the film stack of the patterned hardmask layer 109 and the patterned material layer 107, and the second features 123 of the patterned material layer 107 as a mask. In one embodiment, a polysilicon layer is used as the gate layer 105. The polysilicon layer is etched with a plasma process in $Cl_2/HBr/O_2$ ambient environment. In the embodiment of FIGS. 1-9 the material layer 107 is patterned first, and the gate layer 105 is patterned second. Since the desired method could be applied to other structures, the material 107 can be referred to the first material layer being patterned, and the gate layer 105 can be referred to as the second material layer being patterned.

Figure 9:
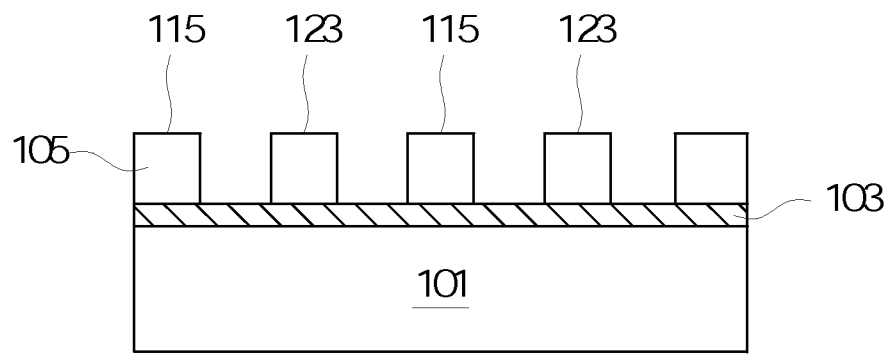

Referring to FIG. 9, the hardmask layer 109 and the material layer 107 are removed. The gate structures with the first features 115 and the second features 123 are formed in the gate layer 105. Each of the first features 115 is flanked by two second features 123. Each of the first features 115 has a second pitch P2 to the adjacent second feature 123. Each of the second features 123 has a third pitch P3 to the adjacent first feature 115. The sum of the second pitch P2 and the third pitch P3 equal to the first pitch P1. In one embodiment, the second pitch P2 and the third pitch P3 substantially equal. The second pitch P2 and the third pitch P3 is substantially one-half of the first pitch P1. In other embodiment, at least one of the second pitch P2 and the third pitch P3 is less than 80 nm. Though the present example illustrates the patterning of one or more gate structures, it is understood that the material layers may be patterned to form any desired feature.

Referring to the drawings, FIGS. 10 to 20 depict a second embodiment of the integrated circuit pitch reduction method of the present invention.

Figure 10:
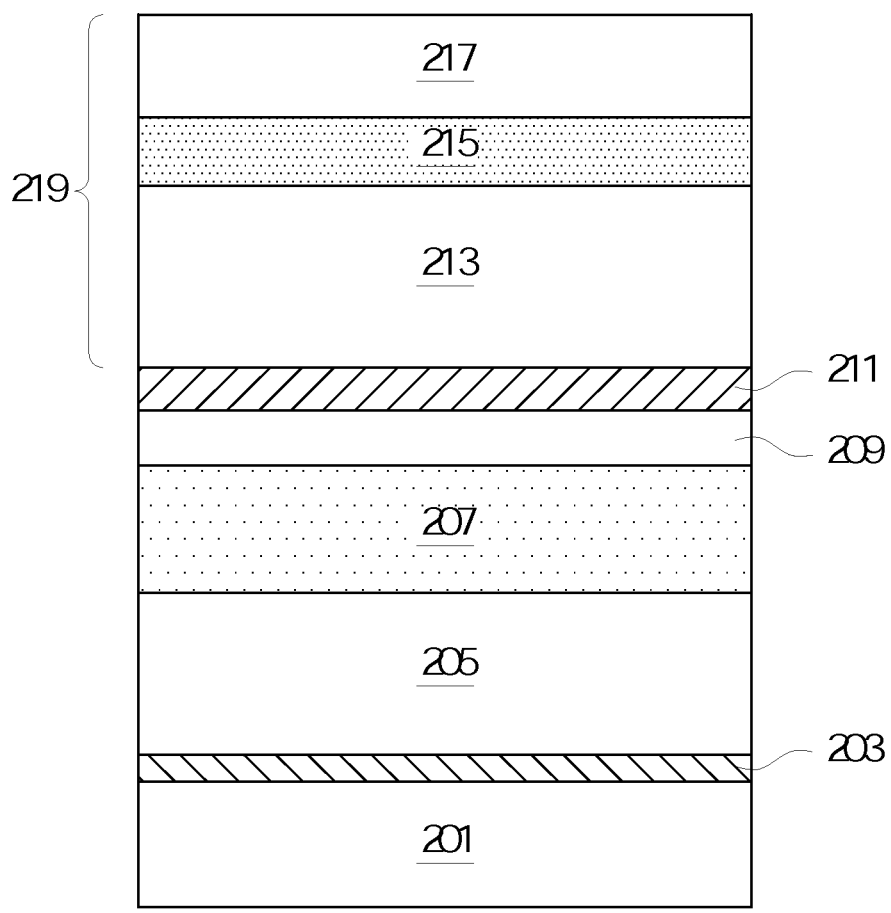
FIGS. 10 to 20 are cross-sectional views showing various stages during fabrication of a structure according to the second embodiment.

Referring to FIG. 10, a dielectric layer 203, a third material layer 205, a first material layer 207, a second material layer 209, a hardmask layer 211, a first imaging layer 219 are formed over the substrate 201. The layers 205, 207, 209, 211 and 219 are patterned, as will be further discussed below, to form one or more features over the substrate 201. Additional layers may be formed above and/or below the material layers 203, 205, 207, 209, 211 and 219 including liner layers, interface layers, seed layers, adhesion layers, barrier layers, etc. It is understood that the material layers may be patterned to form any desired feature, such as gate structures, lines, etc.

The dielectric layer 203 is formed over the substrate 201 by any suitable process to any suitable thickness. The material of the dielectric layer 203 is the same as the gate dielectric layer 103 in the previous paragraph. The dielectric layer 203 herein is not limited to the gate dielectric function.

The third material layer 205 is formed over the gate dielectric layer 203 by any suitable process to any suitable thickness. In one embodiment, the third material layer 205 is a gate layer, which is the same as the gate layer 105 described in the previous paragraph. In other embodiments, the third material layer 205 comprises oxide, nitride, silicon oxynitride or other proper materials that may be patterned and layer 205 has relative etching selectivity to the above first material 207.

The first material layer 207 is formed over the third material layer 205 by any suitable process. The first material layer 207 comprises photoresist layer, anti-reflective coating (BARC) layer, polysilicon layer or strippable amorphous carbon material. Alternatively, the first material layer 207 may comprises any suitable material that be used as an etching mask for the underlying third material layer 205 for the following etching process. In other words, the first layer 207 has a higher etch resistance than the third material layer 205 during the third material layer 205 etching process. The first material layer 207 is formed to any suitable thickness. For example, the first material layer 207 comprises a thickness of approximately 600 to 1400 Å

The second material layer 209 is formed on the first material layer 207 by any suitable process. The material layer 209 comprises oxide, nitride, silicon oxynitride or other proper materials that may be used as an etching mask layer for the underlying first material layer 207 for the following etching process. In other words, the second material layer 209 has a higher etch resistance than the first material layer 207 during the first material layer 207 etching process. The second material layer 209 is formed to any suitable thickness. For example, the second material layer 209 comprises a thickness of approximately 100 to 400 Å

The hardmask layer 211 is formed on the second material layer 209 by any suitable process. The material of the hardmask layer 211 is the same as the hardmask layer 109 in the previous paragraph. The hardmask layer 211 may be used as an etching mask for the underlying second material layer 209 for the following etching process. In other words, the hardmask layer 211 has a higher etch resistance than the second material layer 209 during the second material layer 209 etching process. The second material layer 209 is formed to any suitable thickness. For example, the second material layer 209 comprises a thickness of approximately 100 to 400 Å.

The first imaging layer 219 is formed on the hardmask layer 211. The first imaging layer 219 comprises at least three layers—a bottom layer 213, a middle layer 215 and an upper layer 217. The bottom layer 213 is formed on the hardmask layer and underlying the middle layer 215. The middle layer 215 is formed over the bottom layer 213 and underlying the upper layer 217. The upper layer 217 is formed over the middle layer 215. The bottom, middle, and upper layer 213, 215, 217 comprise various organic and/or inorganic materials. In one embodiment, bottom layer 213 comprises an organic layer, middle layer 215 comprises an inorganic layer, and upper layer 217 comprises an organic layer. The bottom organic layer may comprise a photoresist material, an anti-reflective coating (ARC) material, a polymer material, and/or other suitable materials. The middle inorganic layer may comprise an oxide layer, such as a low temperature CVD oxide, an oxide derived from TEOS (tetraethylorthosilicate), silicon oxide, or silane oxide. Another example includes the middle layer as a Si-containing anti-reflective coating (ARC) material, such as a 42% Si-containing ARC layer. The upper organic layer may comprise an organic photoresist material. Further, the imaging layers 213, 215, 217 comprise any suitable thickness. In one example, the bottom layer 213 comprises a thickness of approximately 600 to 1000 Å. The middle layer 215 comprises a thickness of approximately 100 to 500 Å. The upper layer 217 comprises a thickness of approximately 550 to 950 Å.

Figure 11:
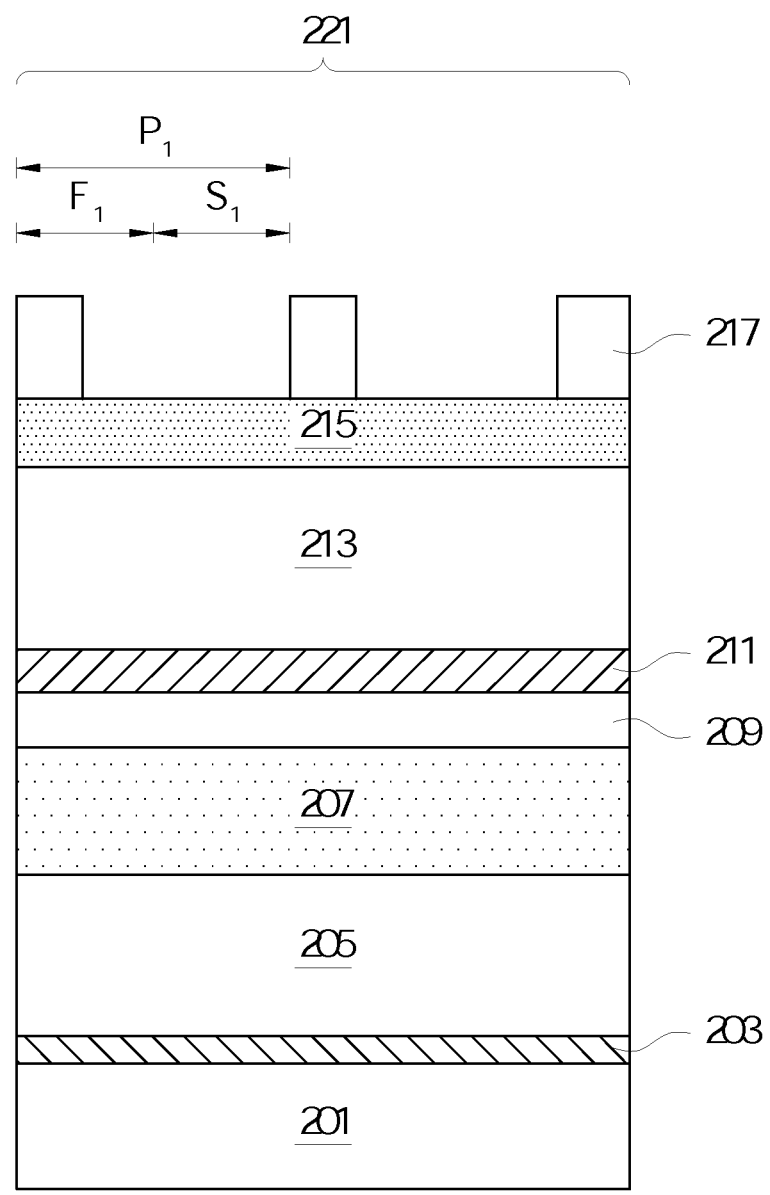

Referring to FIG. 11, upper layer 217 of the first imaging layer 219 is patterned by photolithography patterning processes. The processes may include exposure, post-exposure baking, developing the photoresist, rinsing, drying (e.g., hard baking), other suitable processes, and/or combinations thereof. The patterned upper layer 217 comprises a plurality of first features 221 over the middle layer 215. A pitch P1 on each of the first features 221 is the minimum distance between the same points of two adjacent first features 221. The pitch P1 equals a width F1 of the first feature 221 plus a space S1 between adjacent the first features 221.

Figure 12:
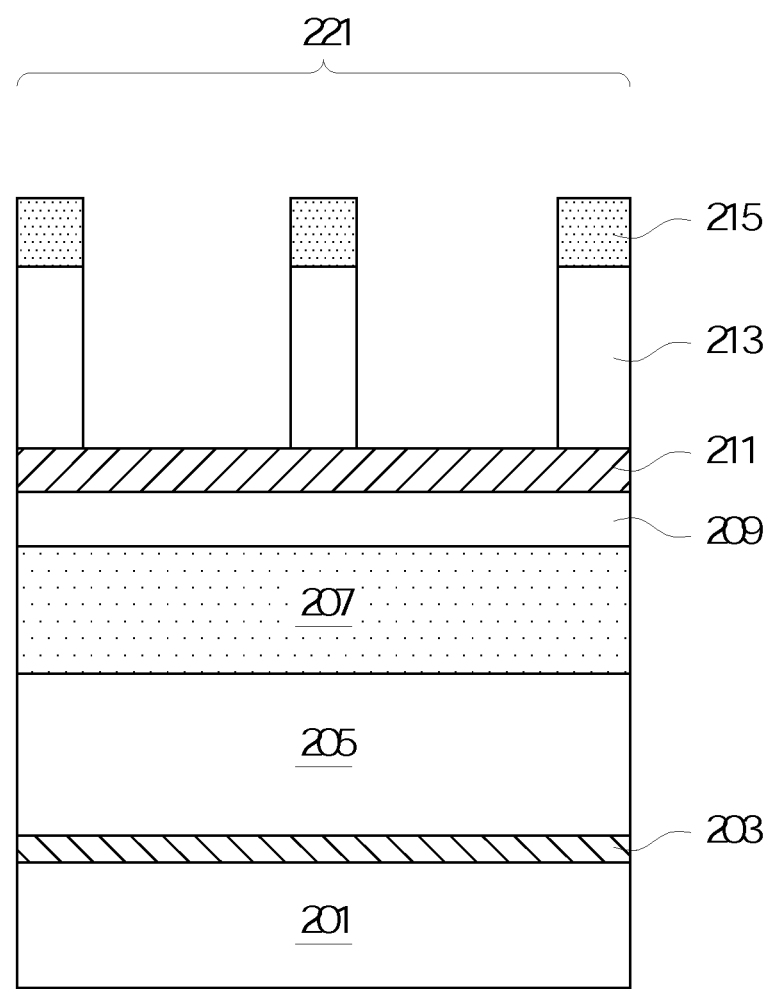

Referring to FIG. 12, the middle layer 215 and the bottom layer 213 are patterned by using the upper layer 217 as a mask. The first features 221 are transferred into the middle layer 215 and the bottom layer 213. In one embodiment, an inorganic Si-containing ARC layer is used as the middle layer 215. An organic bottom anti-reflective coating layer (BARC) is used as the bottom layer 214. The middle layer 215 is etched with a plasma process in a $CF_4$ ambient environment. Then, the bottom layer 213 is etched with a plasma process in a $HBr/O_2$ ambient environment. In one embodiment, the upper layer 217 is consumed and removed during the bottom layer 213 etching process.

Figure 13:
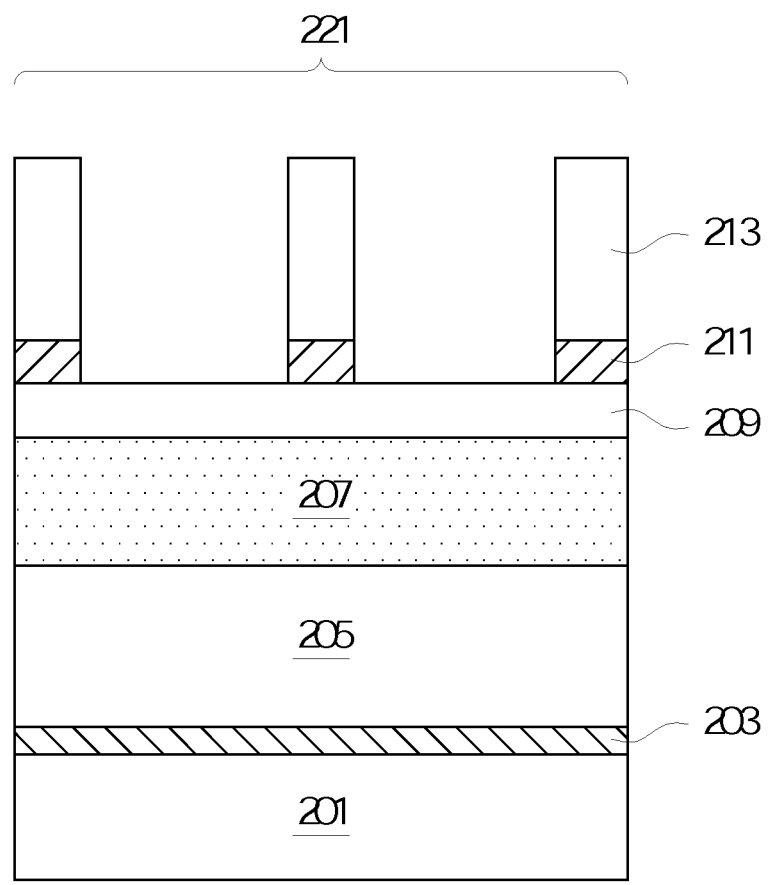

Referring to FIG. 13, the hardmask layer 211 are patterned by using a film stack of the patterned middle layer 215 and the patterned bottom layer 213 as a mask. A portion of a top surface of the second material layer 209 is exposed. The first features 221 are transferred into the hardmask layer 211 from the bottom layer 213 of the first imaging layer 219. In one embodiment, a BARC layer is used as the bottom layer 213. A silicon oxynitride layer is used as the hardmask layer 211. The silicon oxynitride layer is etched with a plasma process in a $CF_4$ ambient environment. In one embodiment, the middle layer 215 is consumed and removed during the hardmask layer 211 etching process. The middle layer 215 has a thickness substantially equal to a thickness of the hardmask layer 211. A dry etching rate of the middle layer 215 substantially equal to a dry etching rate of the hardmask layer 211.

Figure 14:
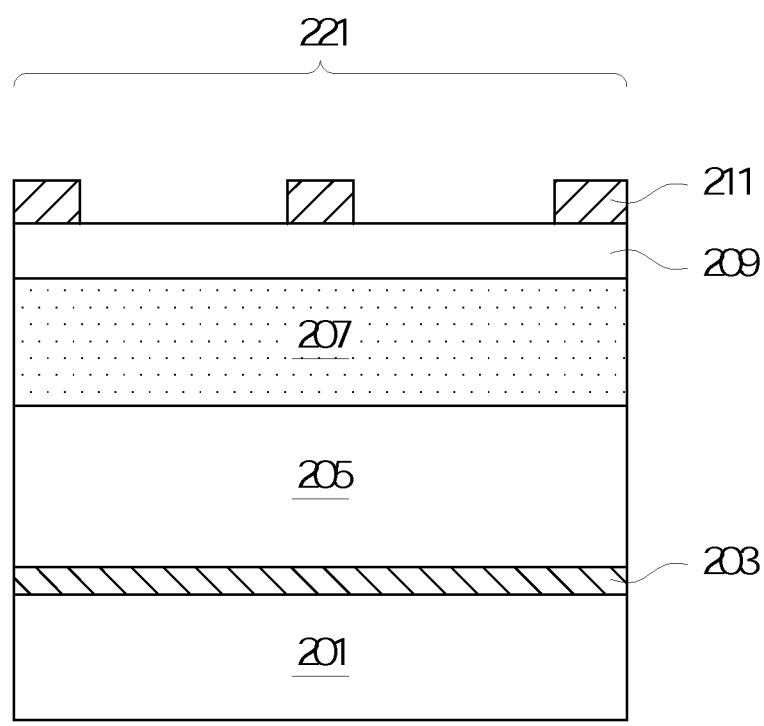

Referring to FIG. 14, the bottom layer 213 on the hardmask layer 211 is removed. In one embodiment, a BARC layer is used as the bottom layer 213. The BARC layer is ashed in an oxygen ambient environment. The patterned hardmask layer 211 is exposed.

Figure 15:
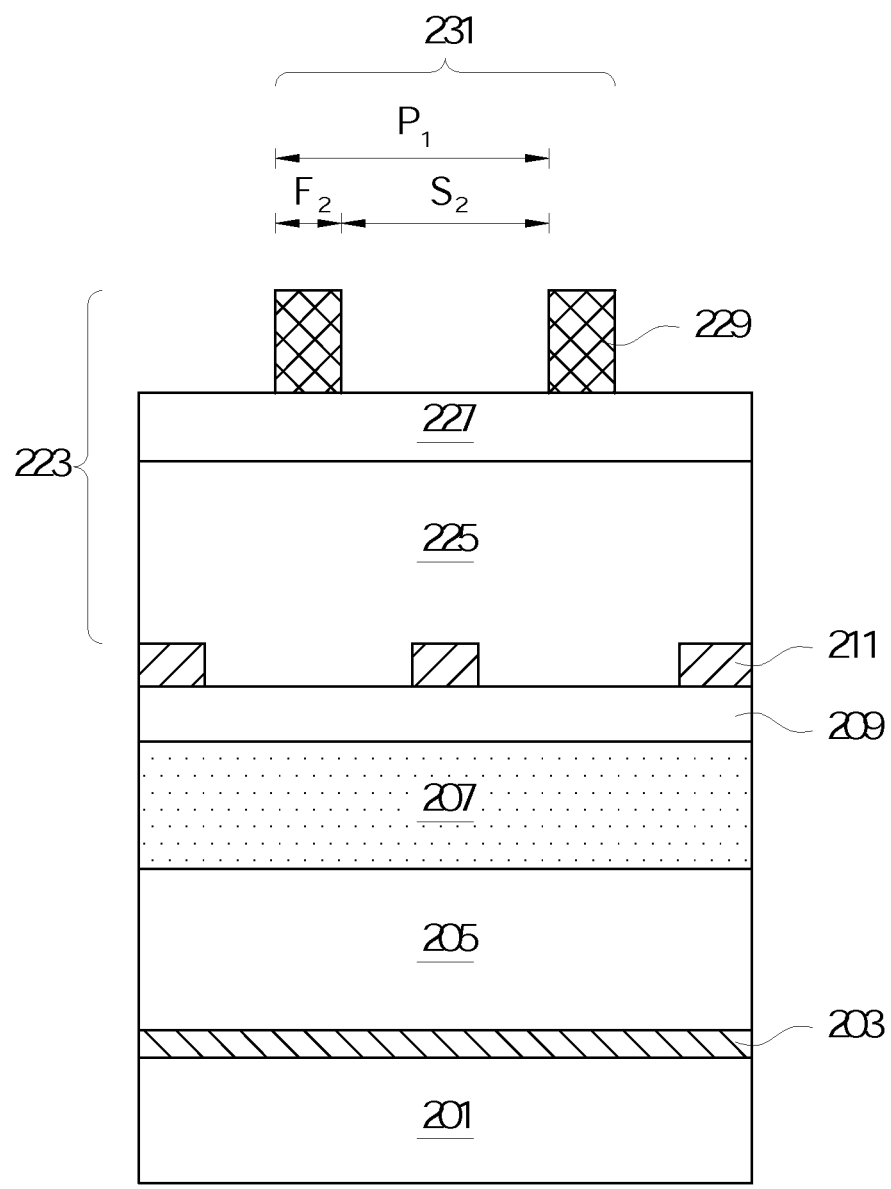

Referring to FIG. 15, a second imaging layer 223 is formed over the patterned hardmask layer 211 and the portion of the top surface of the second material layer 209. The second imaging layer 219 comprising at least three layers—a bottom layer 225, a middle layer 227 and an upper layer 229. The second imaging layer 223 fills in the spaces S1 betweens the first features 221 of the patterned hardmask layer 211. The second imaging layer 223 provides sufficient coverage of the surface topography of the underlying patterned hardmask layer 221. The material and thickness of the second imaging layer 223—the bottom layer 225, the middle layer 227 and the upper layer 229—is the same as the first imaging layer 219 in the previous paragraphs.

Next, the patterned upper layer 229 is formed by photolithography patterning processes. The processes may include mask aligning, exposure, post-exposure baking, developing the photoresist, rinsing, drying (e.g., hard baking), other suitable processes, and/or combinations thereof. The patterned upper layer 229 comprises a plurality of second features 231 over the middle layer 227. Each of the second features 231 between adjacent second features 231 has the pitch P1, the width F2 and the space S2. The pitch P1 equals the width F2 of the second feature 231 plus the space S2 between adjacent the second features 231. The first features 221 on the patterned hardmask layer 211 do not overlap the second features 231 on the patterned upper layer 229. In other words, the first features 221 and the second features 231 are alternately arranged.

Figure 16:
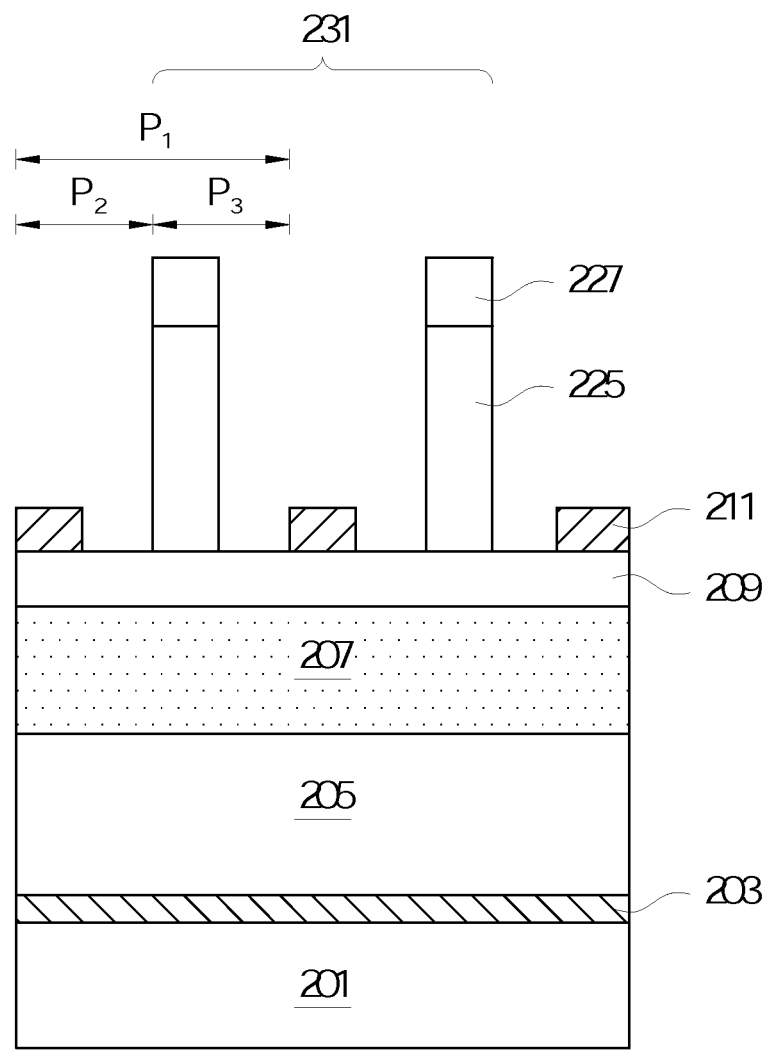

Referring to FIG. 16, the middle layer 227 and the bottom layer 225 are patterned by using the upper layer 229 as a mask. In one embodiment, an inorganic Si-containing ARC layer is used as the middle layer 227. An organic bottom anti-reflective coating layer (BARC) is used as the bottom layer 225. The middle layer 227 is etched with a plasma process in a $CF_4$ ambient environment. Then, the bottom layer 225 is etched with a plasma process in a $HBr/O_2$ ambient environment.

The second features 231 are transferred from the patterned upper layer 229 into a film stack of the middle layer 227 and the bottom layer 225 by etching. The first features 221 of the patterned hardmask layer 211 and the second features 231 of the patterned film stack of the middle layer 227 and the bottom layer 225 are alternately arranged on the top surface of the second material layer 209. Each of the first features 221 is flanked by two second features 231. Each of the first features 221 has a second pitch P2 to the adjacent second feature 231. Each of the second features 231 has a third pitch P3 to the adjacent first feature 221. The sum of the second pitch P2 and the third pitch P3 is equal to the first pitch P1. In one embodiment, the second pitch P2 and the third pitch P3 are substantially equal. The second pitch P2 and the third pitch P3 are substantially one-half of the first pitch P1. In other embodiments, at least one of the second pitch P2 and the third pitch P3 is less than 80 nm.

Figure 17:
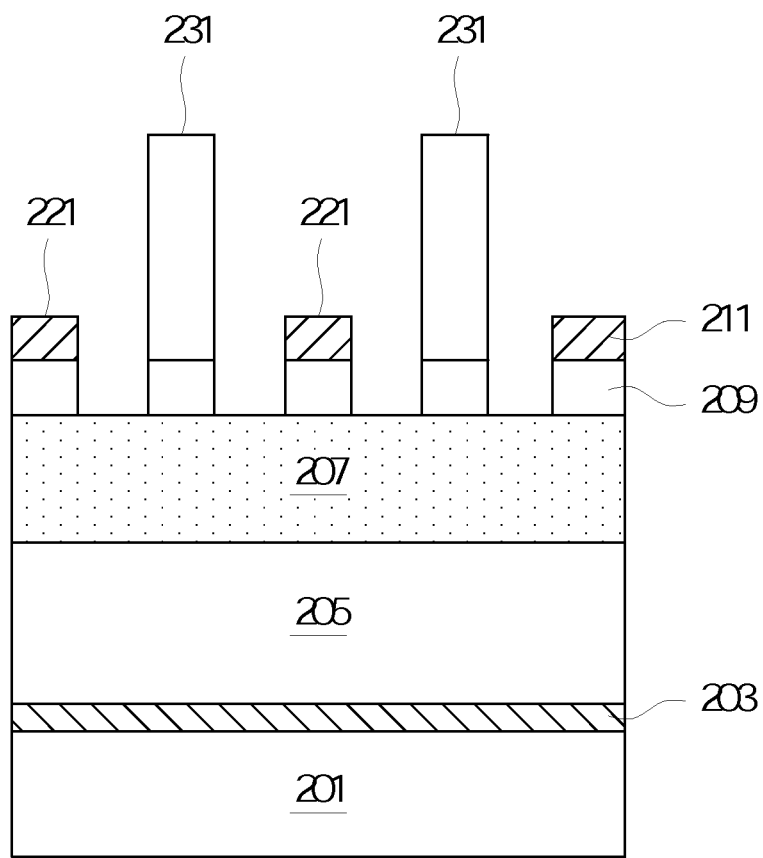

Referring to FIG. 17, the second material layer 209 is patterned by using the patterned the film stack of the middle layer 227 and the bottom layer 225, and the patterned hardmask layer 211 as a mask. In one embodiment, an oxide layer is used as the second material layer 209. The oxide layer is etched with a plasma process in $CF_4$ ambient environment. In one embodiment, the middle layer 227 is consumed and removed during the second material layer 209 etching process. The middle layer 227 has a thickness substantially equal to a thickness of the second layer 209. A dry etching rate of the middle layer 227 is substantially equal to a dry etching rate of the second layer 209. The first features 221 and the second features 231 are transferred into the patterned second material layer 209. Each of the first features 221 is flanked by two second features 231. Each of the first features 221 has a second pitch P2 to the adjacent second feature 231. Each of the second features 231 has a third pitch P3 to the adjacent first feature 221. The sum of the second pitch P2 and the third pitch P3 are equal to the first pitch P1.

Figure 18:
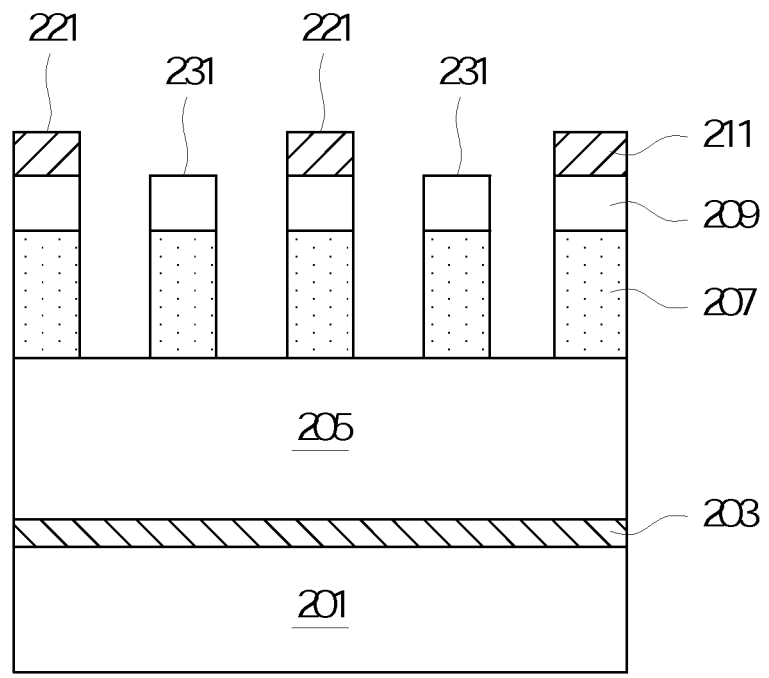

Referring to FIG. 18, the first material layer 207 is patterned by using a patterned film stack of the bottom layer 225 and the second material layer 209, and a patterned film stack of hardmask layer 211 and the second material layer 209 as a mask. The first features 221 and the second features 231 are transferred into the patterned first material layer 207 by etching. In one embodiment, a strippable amorphous carbon material is used as the first material layer 207. The first material layer 207 is etched with a plasma process in a $HBr/Cl_2/O_2/SO_2$ ambient environment. In one embodiment, the bottom layer 225 is consumed and removed during the first material layer 207 etching process. A dry etching rate of the second bottom layer 225 is substantially equal to a dry etching rate of the first material layer 207.

Figure 19:
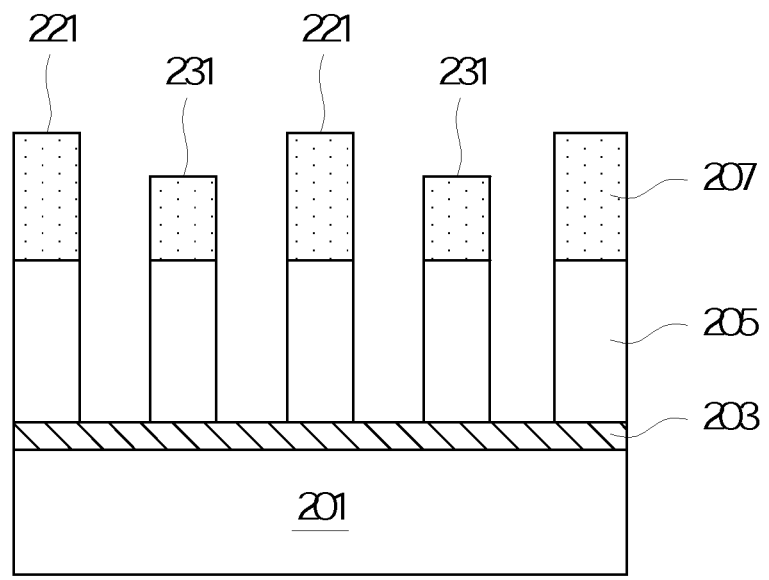

Referring to FIG. 19, the third material layer 205 is patterned by using a patterned film stack of the hardmask layer 211, second material layer 209 and the first material layer 207, and a patterned film stack of the second material layer 209 and the first material 207 as a mask. The first features 221 and the second features 231 are formed in the third material layer 205. In one embodiment, a silicon oxynitride layer is used as the hardmask layer 211. An oxide layer is used as the second material layer 209. A strippable amorphous carbon material is used as the first material layer 207. A polysilicon layer is used as the third material layer 205. The polysilicon layer is etched with a plasma process in fluorine ambient environment, such as $CF_4$. The patterned film stack of the hardmask layer 211 and second material layer 209 are consumed and removed during the first material layer 207 etching process. The patterned first material layer 207 is left on the third material layer 205.

Figure 20:
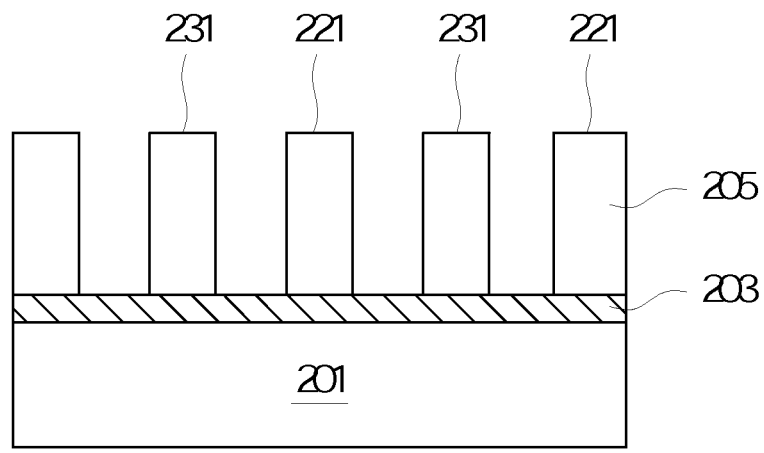

Referring to FIG. 20, the patterned first material layer 207 is removed. The first features 221 and the second features 231 are formed on the third material layer 205. Each of the first features 221 is flanked by two second features 231. Each of the first features 221 has a second pitch P2 to the adjacent second feature 231. Each of the second features 231 has a third pitch P3 to the adjacent first feature 221. The sum of the second pitch P2 and the third pitch P3 equal to the first pitch P1. In one embodiment, the first features 221 and the second features 223 have the same feature. The second pitch P2 and the third pitch P3 are substantially equal. The second pitch P2 and the third pitch P3 are each substantially one-half of the first pitch P1. In other embodiments, at least one of the second pitch P2 and the third pitch P3 is less than 80 nm.

In one embodiment, the third material layer 205 is a gate layer, such as a polysilicon layer. A gate oxide layer 203 is formed under the gate layer. Gate structures are formed in the third material layer 205. Though the present example illustrates the patterning of one or more gate structures, it is understood that the material layers may be patterned to form any desired feature, such as lines and shallow trench isolation (STI), etc.

Referring to the drawings, FIGS. 21 to 24 illustrate a variation of the process steps of FIGS. 18 to 20 for a third embodiment of the integrated circuit pitch reduction method.

Figure 21:
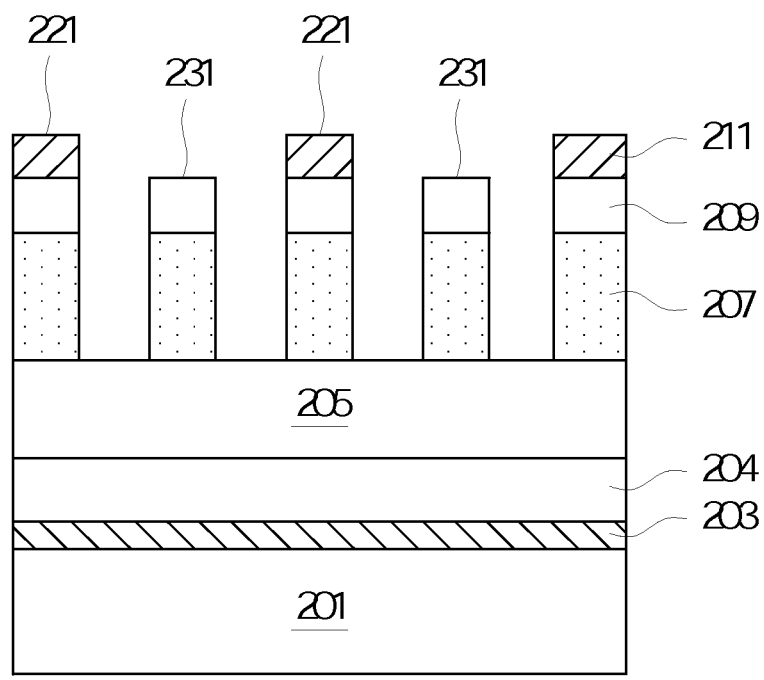
FIGS. 21 to 24 are cross-sectional views showing various stages during fabrication of a structure according to the third embodiments.

Referring to FIG. 21, the film stack shown is similar to FIG. 18 except that a fourth material layer 204 is formed over the dielectric layer 203 and under the third material layer 205. As shown in FIG. 21, the dielectric layer 203, a fourth material layer 204, the third material layer 205, the first material layer 207, the second material layer 209, the hardmask layer 211 are formed over the substrate 201. The material of the layer 203, 205, 207, 209 and 211 are the same in the previous paragraphs. The fourth material layer 204 comprises oxide, nitride, silicon oxynitride or other proper materials that may be patterned and layer 204 has relative etching selectivity to the above third material 205.

Still referring to FIG. 21, the first material layer 207 is patterned as previous described by using the patterned film stack of the bottom layer 225 and the second material layer 209, and the patterned film stack of hardmask layer 211 and the second material layer 209 as a mask. The first features 221 and the second features 231 are transferred into the patterned first material layer 207 by etching.

Figure 22:
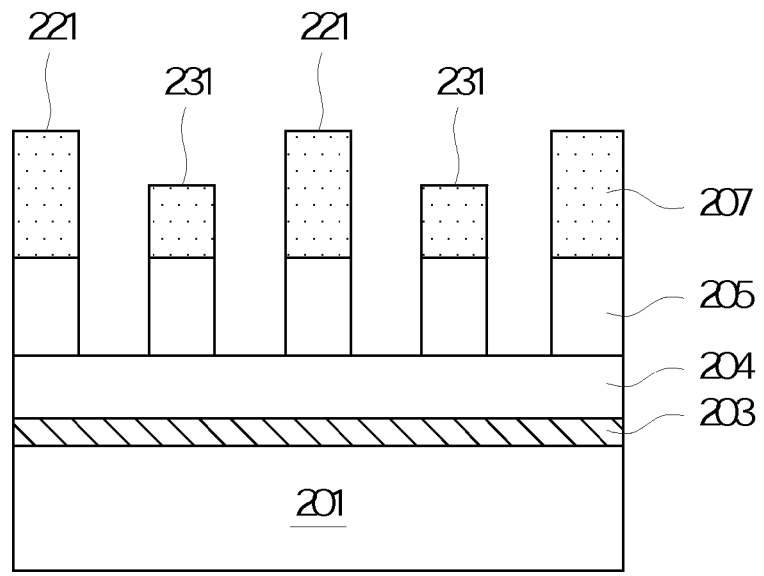

Referring to FIG. 22, the third material layer 205 and the fourth material 204 are patterned by using the patterned film stack of the hardmask layer 211, the second material layer 209 and the first material layer 207, and the patterned film stack of the second layer 209 and the first material layer 207 as a mask. The first features 221 and the second features 231 are transferred into the patterned third material layer 205 and the fourth material 204. In one embodiment, an oxide layer is used as the third material layer 205. A nitride layer is used as the fourth material layer 204. First, the third material layer 205 is etched with a plasma process in a $CF_4$ ambient environment. Next, the fourth material 204 is etched with another plasma process in a $CF_4$ ambient environment. In one embodiment, the hardmask layer 211 and the second material layer 209 are consumed and removed during the third material layer 205 and the fourth material layer 204 etching processes.

Figure 23:
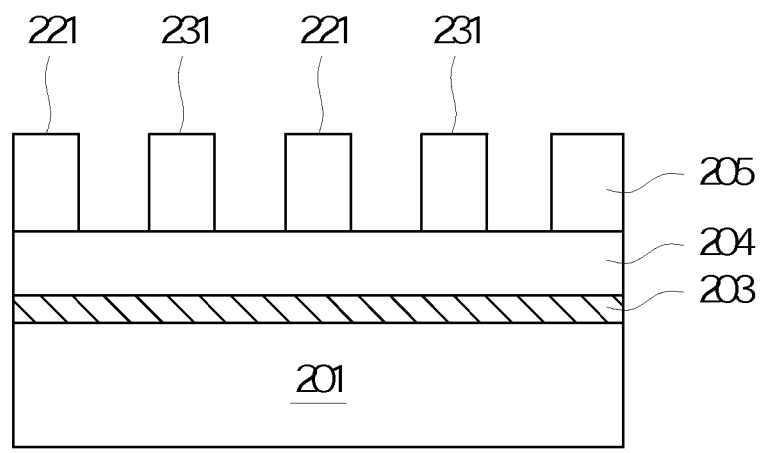

Referring to FIG. 23, the patterned first material layer 207, which above the patterned film stack of the third material layer 205 and the fourth material layer 204, is removed. The first features 221 and the second features 231 of the patterned film stack of the third material layer 205 and the fourth material layer 204 are formed.

In one embodiment, a strippable amorphous carbon material is used as the first material layer 207. The first material layer 207 is ashed with a plasma process in an $O_2$ ambient environment. The pattern film stack of the third material layer 205 and the fourth material layer 204 are left as an etching mask for the etching of the underlying layers.

Figure 24:
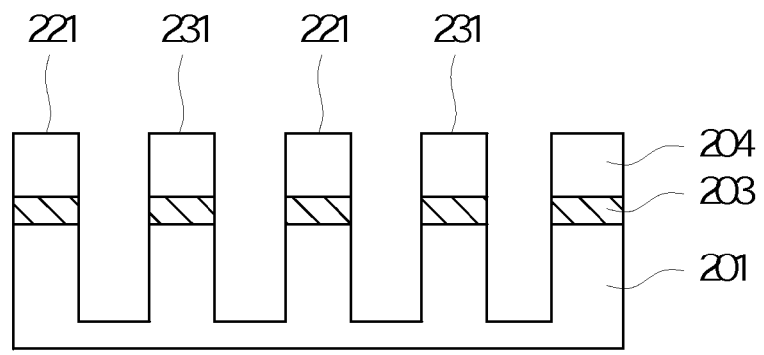

Referring to FIG. 24, the pattern film stack of the third material layer 205 and the fourth material layer 204 is used as an etching mask. The dielectric layer 203 and a portion of the substrate are etched to form a plurality of shallow trench isolations (STI) 233. The plurality of STIs 233 are divided into the first features 221 and the second features 231. Each of the first features 221 is flanked by two second features 231. Each of the first features 221 has a second pitch P2 to the adjacent second feature 231. Each of the second features 231 has a third pitch P3 to the adjacent first feature 221. The sum of the second pitch P2 and the third pitch P3 is equal to the first pitch P1. In one embodiment, the first features 221 and the second features 223 have the same feature. The second pitch P2 and the third pitch P3 are substantially equal. The second pitch P2 and the third pitch P3 are substantially one-half of the first pitch P1. In other embodiment, at least one of the second pitch P2 and the third pitch P3 is less than 80 nm.

Note that in all of the above embodiments, the feature narrowing process described herein can be repeated if desired, assuming appropriate materials are used in the starting structure of FIGS. 1 and 10, and substrate 101 and 201 include appropriate sublayers superposing the bulk support material. The repeated feature narrowing process can be thought of as being constructed by adding a second instance of the process steps described above either before or after the first instance described above.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of pitch reduction, the method comprising:
   providing a substrate;
   forming a first material layer over the substrate;
   forming a second material layer on the first material layer;
   forming a hardmask layer on the second material layer;
   forming a first imaging layer on the hardmask layer;
   patterning the first imaging layer to form a plurality of first features over the hardmask layer, the plurality of first features having a first pitch between adjacent first features,
   etching the hardmask layer utilizing the first imaging layer as a mask to transfer the plurality of first features into the hardmask layer and expose a portion of a top surface of the second material layer;
   removing the first imaging layer to expose the etched hardmask layer;
   forming a second imaging layer on the etched hardmask layer and the portion of the top surface of the second material layer;
   patterning the second imaging layer to form a plurality of second features over the second material layer, the plurality of second features having the first pitch between adjacent second features, the plurality of first features of the etched hardmask layer and the plurality of second features of the second imaging layer being alternately arranged on the top surface of the second material layer; and
   etching the second material layer utilizing the etched hardmask layer and the patterned second imaging layer as a mask to transfer the plurality of first features and the plurality of second features into the second material layer.

2. The method of claim 1, wherein the first imaging layer comprises a first top organic layer, a first middle inorganic layer underlying the first top organic layer, and a first bottom organic layer underlying the first middle inorganic layer.

3. The method of claim 2, wherein the first middle inorganic layer is removed during etching the hardmask layer.

4. The method of claim 2, wherein a thickness of the first middle inorganic layer is substantially equal to a thickness of the hardmask layer.

5. The method of claim 2, wherein a dry etching rate of the first middle inorganic layer is substantially equal to a dry etching rate of the hardmask layer.

6. The method of claim 1, further comprising etching the first material layer utilizing a film stack of the patterned second imaging layer and the etched second material layer, and a film stack of the etched hardmask layer and the etched second material layer as a mask.

7. The method of claim 1, wherein the second imaging layer comprises a second top organic layer, a second middle inorganic layer underlying the second top organic layer, and a second bottom organic layer underlying the second middle inorganic layer.

8. The method of claim 7, wherein the second middle inorganic layer is removed during etching the second material layer.

9. The method of claim 7, wherein the second bottom organic layer is removed during etching the first material layer.

10. The method of claim 7, wherein a dry etching rate of the second bottom organic layer is substantially equal to a dry etching rate of the first material layer.

11. The method of claim 1, further comprising:
    forming a third material layer under the first material layer and over the substrate; and
    etching the third material layer utilizing a film stack of the etched hardmask layer, the etched second material layer and the etched first material layer, and a film stack of the etched second material layer and the etched first material layer as a mask, wherein the etched hardmask layer and the etched second material is removed during etching the third material layer.

12. The method of claim 1, wherein a pitch between adjacent the first features and the second features is substantially one-half of the first pitch.

13. The method of claim 1, wherein a pitch between adjacent the first features and the second features is less than 80 nm.

14. A method of pitch reduction, the method comprising:
    providing a substrate;
    forming a first material layer over the substrate;
    forming a second material layer on the first material layer;
    forming a hardmask layer on the second material layer;
    forming a first imaging layer comprising a first top organic layer, a first middle inorganic layer underlying the first top organic layer, and a first bottom organic layer underlying the first middle inorganic layer on the hardmask layer,
    patterning the first imaging layer to form a plurality of first features over the hardmask layer, the plurality of first features having a first pitch between adjacent first features,
    etching the hardmask layer utilizing the first imaging layer as a mask to transfer the plurality of first features into the hardmask layer and expose a portion of a top surface of the second material layer;
    removing the first imaging layer to expose the etched hardmask layer;
    forming a second imaging layer comprising a second top organic layer, a second middle inorganic layer underlying the second top organic layer, and a second bottom organic layer underlying the second middle inorganic layer on the etched hardmask layer and the portion of the top surface of the second material layer;

patterning the second imaging layer to form a plurality of second features on the second material layer, the plurality of second features having the first pitch between adjacent second features, the plurality of first features of the etched hard mask and the plurality of second features of the second imaging layer alternately arranged on the top surface of the second material layer; and etching the second material layer utilizing the etched hardmask layer and the patterned second imaging layer as a mask to transfer the plurality of first features and the plurality of second features into the second material layer.

15. The method of claim 14, wherein the first middle inorganic layer is removed during etching the hardmask layer.

16. The method of claim 14, wherein the second middle inorganic layer is removed during etching the second material layer.

17. A method of pitch reduction, the method comprising:
providing a substrate;
forming a first material layer over the substrate;
forming a second material layer on the first material layer;
forming a hardmask layer on the second material layer;
forming a first imaging layer on the hardmask layer;
patterning the first imaging layer to form a plurality of first features over the hardmask layer, the plurality of first features having a first pitch between adjacent first features,
etching the hardmask layer utilizing the first imaging layer as a mask to transfer the plurality of first features into the hardmask layer and expose a portion of a top surface of the second material layer;
removing the first imaging layer to expose the etched hardmask layer;
forming a second imaging layer on the etched hardmask layer and the portion of the top surface of the second material layer;
patterning the second imaging layer to form a plurality of second features over the second material layer, the plurality of second features having the first pitch between adjacent second features, the plurality of first features of the etched hard mask and the plurality of second features of the second imaging layer being alternately arranged on the top surface of the second material layer; and
etching the second material layer utilizing the etched hardmask layer and the patterned second imaging layer as a mask to transfer the plurality of first features and the plurality of second features into the second material layer;
forming a third material layer under the first material layer and over the substrate and a fourth material layer under the third material layer; and
etching the third material layer and the fourth material layer utilizing a film stack of the etched hardmask layer, the etched second material layer and the etched first material layer, and a film stack of the etched second material layer and the etched first material layer as a mask, wherein the etched hardmask layer and the etched second material is removed during etching the third material layer and the fourth material layer.

18. The method of claim 17, wherein each first feature has a second pitch to an adjacent second feature and each second feature has a third pitch adjacent to the first feature.

19. The method of claim 18, wherein the second pitch and the third pitch are substantially equal.

20. The method of claim 18, wherein the second pitch and the third pitch are substantially one-half of the first pitch.

* * * * *